(12) United States Patent
Kwak et al.

(10) Patent No.: US 8,203,903 B2
(45) Date of Patent: Jun. 19, 2012

(54) MAIN DECODING CIRCUIT AND SEMICONDUCTOR MEMORY APPARATUS INCLUDING THE SAME

(75) Inventors: Seung Wook Kwak, Ichon-si (KR); Kae Dal Kwak, Ichon-si (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 198 days.

(21) Appl. No.: 12/650,790

(22) Filed: Dec. 31, 2009

(65) Prior Publication Data
US 2011/0075503 A1 Mar. 31, 2011

(30) Foreign Application Priority Data

Sep. 30, 2009 (KR) .................. 10-2009-0093593

(51) Int. Cl.
*G11C 8/00* (2006.01)
(52) U.S. Cl. ......... 365/230.06; 365/230.03; 365/230.01; 365/231
(58) Field of Classification Search ............. 365/230.06, 365/230.03, 230.01, 231
See application file for complete search history.

(56) References Cited

U.S. PATENT DOCUMENTS

| | | | |
|---|---|---|---|
| 5,708,623 | A | 1/1998 | Choi |
| 6,101,147 | A | 8/2000 | Takahashi et al. |
| 6,456,558 | B1 | 9/2002 | Cho |
| 6,704,240 | B2 | 3/2004 | Kang |
| 6,819,623 | B2 | 11/2004 | Jung |
| 2005/0141323 | A1 | 6/2005 | Shim |
| 2008/0253218 | A1* | 10/2008 | Park .................. 365/230.06 |

FOREIGN PATENT DOCUMENTS

| | | |
|---|---|---|
| JP | 09-045083 A | 2/1997 |
| JP | 09-219091 A | 8/1997 |
| KR | 1020080092087 A | 10/2008 |

* cited by examiner

*Primary Examiner* — Thong Q Le
(74) *Attorney, Agent, or Firm* — Ladas & Parry LLP

(57) ABSTRACT

A main decoding circuit includes a shared column selection signal generating unit and a switching unit. The shared column selection signal generating unit receives a column decoding signal to generate a shared column selection signal. The switching unit selectively provides the shared column selection signal to one of a column selection line of a first memory bank and a column selection line of a second memory bank in response to a bank selection signal.

14 Claims, 6 Drawing Sheets

MAIN DECODING CIRCUIT AND SEMICONDUCTOR MEMORY APPARATUS INCLUDING THE SAME

CROSS-REFERENCES TO RELATED APPLICATION

The present application claims priority to Korean application number 10-2009-0093593, filed on Sep. 30, 2009, which is incorporated by reference in its entirety as set forth in full.

BACKGROUND OF THE INVENTION

1. Technical Field

Embodiments of the present invention relate to a semiconductor apparatus, and more particularly, to a main decoding circuit of the semiconductor memory apparatus.

2. Related Art

As the demand for a high-speed semiconductor memory apparatus has increased, semiconductor memory apparatus designs having a stack bank structure have been recently used so as to improve data access times. In the semiconductor memory apparatus having the stack bank structure, a memory cell region is partitioned into a plurality of memory blocks, and a plurality of stacked memory banks respectively comprise the memory block.

FIG. 1 is a block diagram schematically showing a configuration of a conventional semiconductor memory apparatus having the stack bank structure. As shown in FIG. 1, the semiconductor memory apparatus includes first and second memory banks Bank0 and Bank1, a predecoder 10, and first and second main decoding units 21 and 22. The first and second memory banks Bank0 and Bank1 constitute the stack bank structure. That is, the first memory bank Bank0 corresponds to an up bank and the second memory bank Bank1 corresponds to a down bank. At the respective first and second memory banks Bank0 and Bank1, a bit line (not shown) for accessing data stored in a memory cell is disposed, and a local input/output line (not shown) electrically connected to the respective bit line is disposed. The electrical connection between the bit line and the local input/output line is made by enabling column selection lines CSL_up<0:n> and CSL_dn<0:n>. The column selection lines CSL_up<0:n> and CSL_dn<0:n> are respectively disposed at the first and second memory banks Bank0 and Bank1, and the predecoder 10 and the first and second main decoding units 21 and 22 respectively generate a column selection signal configured to enable the column selection lines CSL_up<0:n> and CSL_dn<0:n>.

The predecoder 10 and the first and second main decoding units 21 and 22 constitute a column decoder of the semiconductor memory apparatus. The predecoder 10 receives column address signals 'bay<2:3>', 'bay<4:5>' and 'bay<6:7, 9>' and strobe signals 'strobe<0:1>' to generate column decoding signals 'lay23_up<0:3>', 'lay23_dn<0:3>', 'lay45' and 'lay679'. In order to generate the column selection signal configured to enable the column selection lines CSL_up<0:n> of the first memory bank Bank0 and the column selection lines CSL_dn<0:n> of the second memory bank Bank1, the predecoder 10 separately generates the column decoding signals 'lay23_up<0:3>' to be provided to the first main decoding unit 21 and the column decoding signals 'lay23_dn<0:3>' to be provided to the second main decoding unit 22, in response to the column address signals 'bay<2:3>' and the strobe signals 'strobe<0:1>'.

The first main decoding unit 21 is enabled in response to the column decoding signals 'lay23_up<0:3>', 'lay45' and 'lay679' generated from the predecoder 10, and generates the column selection signal configured to enable the column selection lines CSL_up<0:n> of the first memory bank Bank0. On the other hand, the second main decoding unit 22 is enabled in response to the column decoding signals 'lay23_dn<0:3>', 'lay45' and 'lay679' generated from the predecoder 10, and generates the column selection signal configured to enable the column selection lines CSL_dn<0:n> of the second memory bank Bank1. As shown in FIG. 1, the respective first and second main decoding units 21 and 22 can comprise a plurality of main decoders Main_DEC having a substantially the same configurations. Herein, for example, four column selection lines can be assigned to each of the plurality of main decoders Main_DEC.

The column decoding signals 'lay45' and 'lay679' generated from the predecoder 10 determine which one of the plurality of main decoders Main_DEC constituting the first main decoding unit 21 is to be enabled and in which one of the plurality of main decoders Main_DEC corresponding to the second main decoding unit 22 is to be enabled. In addition, the column decoding signals 'lay23_up<0:3>' and 'lay23_dn<0:3>' determine which one of the four column selection lines assigned to the main decoder, being enabled in response to the column decoding signals 'lay45' and 'lay679', is to be enabled. Therefore, the first main decoding unit 21 can enable any one of the column selection lines CSL_up<0:n> of the first memory bank Bank0 in response to the column decoding signals 'lay23_up<0:3>', 'lay45' and 'lay679', and on the other hand, the second main decoding unit 22 can enable any one of the column selection lines CSL_dn<0:n> of the second memory bank Bank1 in response to the column decoding signals 'lay23_dn<0:3>', 'lay45' and 'lay679'.

As such, according to the prior art, each of the plurality of memory banks constituting the stack bank structure necessarily requires a separate main decoding circuit. That is, since the column selection lines of the plurality of memory banks constituting the stack bank structure are different from each other and it is necessary to reduce a load on the main decoding circuit facing the column selection line, then the separate main decoding circuit is required for each of the plurality of stacked memory banks.

SUMMARY OF THE INVENTION

The embodiments of the present invention include a main decoding circuit, capable of being shared by a plurality of memory banks constituting a stack bank structure, and a semiconductor memory apparatus including the same.

In one embodiment of the present invention, a main decoding circuit includes: a shared column selection signal generating unit configured to receive a column decoding signal to generate a shared column selection signal; and a switching unit configured to selectively provide the shared column selection signal to one of a column selection line of a first memory bank and a column selection line of a second memory bank in response to a bank selection signal.

In another embodiment of the present invention, a main decoding circuit includes: a first column selection signal generating unit configured to receive a column decoding signal to generate a column selection signal, when the first column selection signal generating unit receives a driving voltage and thereby is enabled, the column selection signal configured to enable a column selection line of a first memory bank; a second column selection signal generating unit configured to receive the column decoding signal to generate a column selection signal, when the second column selection signal generating unit receives the driving voltage and thereby is enabled, the column selection signal configured to enable a column selection line of a second memory bank; and a power supply unit configured to selectively provide the driving voltage to the first and second column selection signal generating units in response to the column decoding signal and a bank selection signal.

In still another embodiment of the present invention, a semiconductor memory apparatus includes: a first column selection line configured to be coupled to a first memory bank; a second column selection line configured to be coupled to a second memory bank; a predecoding unit configured to receive a column address signal, a bank address signal and a strobe signal to generate a column decoding signal and a bank selection signal; and a shared main decoding unit configured to generate a shared column selection signal in response to the column decoding signal and provide the shared column selection signal to one of the first and second column selection lines in response to the bank selection signal.

In still another embodiment of the present invention, a semiconductor memory apparatus includes: a first column selection line configured to be coupled to a first memory bank; a second column selection line configured to be coupled to a second memory bank; a predecoding unit configured to receive a column address signal, a bank address signal and a strobe signal to generate a column decoding signal and a bank selection signal; and a shared main decoding unit configured to generate a column selection signal in response to the column decoding signal and the bank selection signal, the column selection signal configured to enable one of the first and second column selection lines.

BRIEF DESCRIPTION OF THE DRAWINGS

Features, aspects, and embodiments are described in conjunction with the attached drawings, in which.

DETAILED DESCRIPTION OF THE PREFERRED EMBODIMENTS

Hereinafter, a main decoding circuit and a semiconductor memory apparatus including the same, according to the present invention, will be described below with reference to the accompanying drawings through preferred embodiments.

Figure 2:
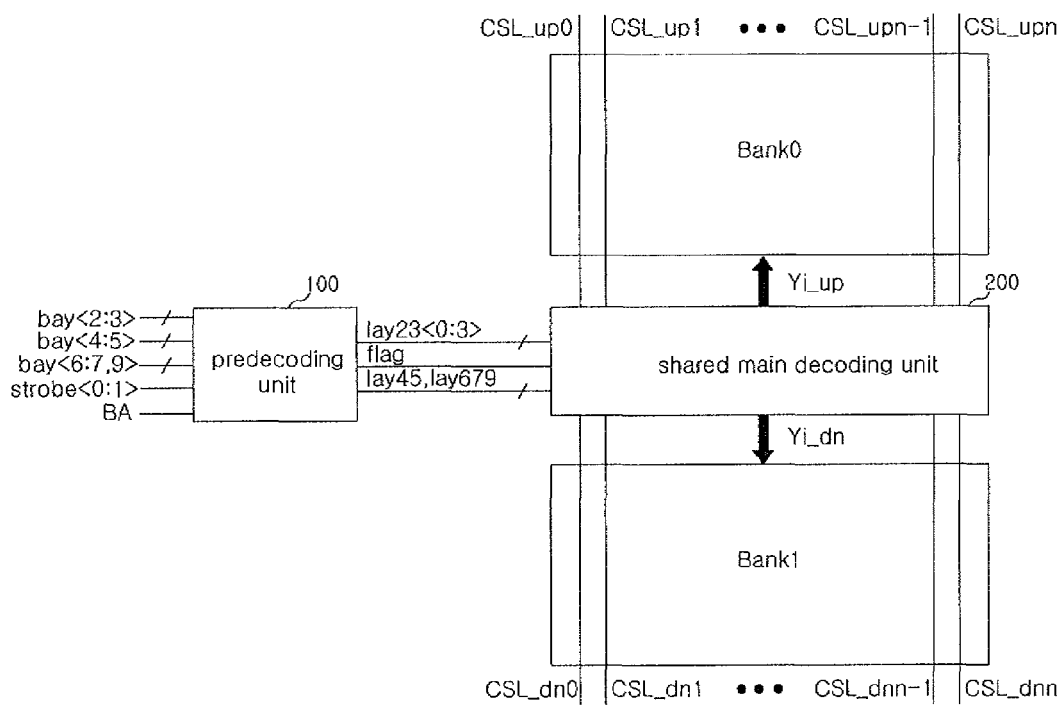
FIG. 2 is a block diagram schematically showing a configuration of a semiconductor memory apparatus having a stack bank structure, according to the embodiment of the present invention.

FIG. 2 is a block diagram schematically showing a configuration of a semiconductor memory apparatus having a stack bank structure, according to the embodiment. As shown in FIG. 2, the semiconductor memory apparatus 1 according to the embodiment of the present invention includes a first memory bank Bank0, a second memory bank Bank1, a predecoding unit 100, and a shared main decoding unit 200.

Hereinafter, it is assumed that the first and second memory banks Bank0 and Bank1 in the semiconductor memory apparatus 1 constitute the stack bank structure. At the first memory bank Bank0, the first column selection lines CSL_up<0:n> electrically connected thereto are disposed. When a column selection signal 'Yi_up' enables the first column selection lines CSL_up<0:n>, the first column selection lines CSL_up<0:n> can make a local input/output line (not shown) to be electrically connected to a corresponding bit line (not shown) which is disposed at the first memory bank Bank0. The bit line is electrically connected to a memory cell (not shown) in the first memory bank Bank0. Therefore, when the first column selection lines CSL_up<0:n> are enabled during a read/write operation of the semiconductor memory apparatus 1, then the semiconductor memory apparatus 1 can output data stored in the first memory bank Bank0 and input data to the first memory bank Bank0 via the local input/output line.

At the second memory bank Bank1, the second column selection lines CSL_dn<0:n> electrically connected thereto are disposed. When a column selection signal 'Yi_dn' enables the second column selection lines CSL_dn<0:n>, the second column selection lines CSL_dn<0:n> can make a local input/output line (not shown) to be electrically connected with a corresponding bit line (not shown) which is disposed at the second memory bank Bank1. The bit line is electrically connected to a memory cell (not shown) in the second memory bank Bank1. Therefore, when the second column selection lines CSL_dn<0:n> are enabled in a read/write operation of the semiconductor memory apparatus 1, then the semiconductor memory apparatus 1 can output data stored into the second memory bank Bank1 and input data from the second memory bank Bank1, via the local input/output line.

The predecoding unit 100 is configured to receive column address signals 'bay<2:3>', 'bay<4:5>' and 'bay<6:7,9>', a bank address signal 'BA', and strobe signals 'strobe<0:1>' to generate column decoding signals 'lay23<0:3>', 'lay45' and 'lay679' and a bank selection signal 'flag'. The column address signals 'bay<2:3>', 'bay<4:5>' and 'bay<6:7,9>' are inputted from outside of the semiconductor memory apparatus 1 via a pad so as to select a column of the semiconductor memory apparatus 1. The bank address signal 'BA' includes information used for selecting a memory bank on which the read/write operation is to be actually performed and is also inputted from the outside via a pad. The strobe signals 'strobe<0:1>' are pulse signals and are generated to indicate that the read/write operation is to be performed when a read/write command is inputted to the semiconductor memory apparatus 1. In general, the strobe signals 'strobe<0:1>' are used to enable an input/output driver (e.g., a DB sense amplifier, a write driver, etc.) configured to perform the read/write operation. Herein, the strobe signal 'strobe<0>' is used to indicate that the read/write operation is to be performed on the first memory bank Bank0, and the strobe signal 'strobe<1>' is used to indicate that the read/write operation is to be performed on the second memory bank Bank1.

The predecoding unit 100 is configured to generate the column decoding signals 'lay23<0:3>', 'lay45' and 'lay679' in response to the corresponding column address signals 'bay<2:3>', 'bay<4:5>' and 'bay<6:7,9>'. Since the column address signals 'bay<2:3>', 'bay<4:5>' and 'bay<6:7,9>' are inputted to select a column of the semiconductor memory apparatus 1, then the column decoding signals 'lay23<0:3>', 'lay45' and 'lay679' include information for selecting one of the first column selection lines CSL_up<0:n> and for selecting one of the second column selection lines CSL_dn<0:n>.

The bank selection signal 'flag' is generated in response to the bank address signal 'BA' and the strobe signals 'strobe<0:1>'. Since the strobe signals 'strobe<0:1>' is used to indicate that the read/write operation is to be performed and the bank address signal 'BA' designates a specific memory bank on which the read/write operation is to be actually performed, then the bank selection signal 'flag' includes information on which one of the first and second memory banks Bank0 and Bank1 the read/write operation is to be actually performed on.

Figure 1:
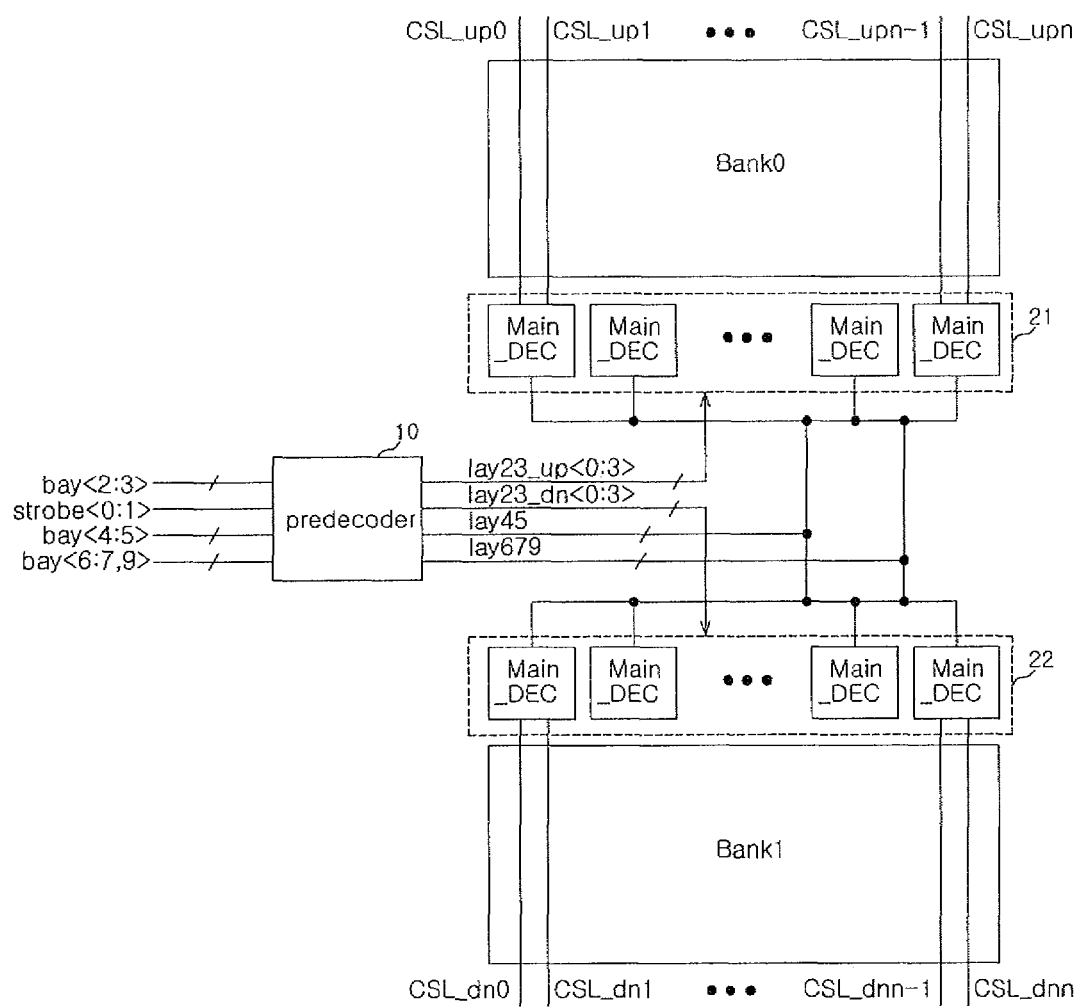
FIG. 1 is a block diagram schematically showing a configuration of a conventional semiconductor memory apparatus having a stack bank structure.

The shared main decoding unit 200 is configured to receive the column decoding signals 'lay23<0:3>', 'lay45' and 'lay679' and the bank selection signal 'flag'. Similar to the main decoding unit of FIG. 1, the shared main decoding unit 200 comprises a plurality of main decoders. In addition, a predetermined number of column selection lines are assigned to a single main decoder. Therefore, the shared main decoding unit 200 is configured to include the plurality of main decoders in proportion to the total number of column selection lines. However, since the operations of the respective main decoders (i.e., the operation for generating the column selection signals 'Yi_up' and 'Yi_dn' in response to the column decoding signals 'lay23<0:3>', 'lay45' and 'lay679' and the bank selection signal 'flag') are substantially the same, then the plurality of main decoders will hereinafter be described as a single block (i.e., as the shared main decoding unit 200).

In order to enable one column selection line among the first column selection lines CSL_up<0:n> and the second column selection lines CSL_dn<0:n>, the shared main decoding unit 200 is configured to generate a column selection signal in response to the column decoding signals 'lay23<0:3>', 'lay45' and 'lay679' and then to provide the column selection signal to one of the first column selection lines CSL_up<0:n> and the second column selection lines CSL_dn<0:n> in response to the bank selection signal 'flag'. Since the column decoding signals 'lay23<0:3>', 'lay45' and 'lay679' are inputted to enable one column selection line among the first column selection lines CSL_up<0:n> and the second column selection lines CSL_dn<0:n> like that in the prior art, then the shared main decoding unit 200 can generate the column selection signal 'Yi_up' which is configured to enable the first column selection lines CSL_up<0:n> and the column selection signal 'Yi_dn' which is configured to enable the second column selection lines CSL_dn<0:n>. Herein, the shared main decoding unit 200 can be implemented in two manners.

The first manner the shared main decoding unit 200 can be implemented is the following manner. Even though only one of the first column selection lines CSL_up<0:n> and the second column selection lines CSL_dn<0:n> is to be enabled, the shared main decoding unit 200 is configured to first generate a shared column selection signal that can enable both the first column selection lines CSL_up<0:n> of the first memory bank Bank0 and the second column selection lines CSL_dn<0:n> of the second memory bank Bank1, and then to provide the shared column selection signal to a column selection line of one specific memory bank that is selected, in response to the bank selection signal 'flag'. For example, in the case where one of the first column selection lines CSL_up<0:n> of the first memory bank Bank0 is to be enabled, the shared main decoding unit 200 is configured to first generate the shared column selection signal that can enable both the first column selection lines CSL_up<0:n> and the second column selection lines CSL_dn<0:n>, and then to provide the shared column selection signal to only the first column selection lines CSL_up<0:n> of the first memory bank Bank0 in response to the bank selection signal 'flag'. On the other hand, in the case where one of the second column selection lines CSL_dn<0:n> of the second memory bank Bank1 is to be enabled, the shared main decoding unit 200 is configured to first generate the shared column selection signal that can enable both the first column selection lines CSL_up<0:n> and the second column selection lines CSL_dn<0:n>, and then to provide the shared column selection signal to only the second column selection lines CSL_dn<0:n> of the second memory bank Bank1 in response to the bank selection signal 'flag'.

A second manner the shared main decoding unit 200 can be implemented is the following manner. The shared main decoding unit 200 is configured to selectively generate the column selection signal 'Yi_up' configured to enable the first column selection lines CSL_up<0:n> of the first memory bank Bank0 and the column selection signal 'Yi_dn' configured to enable the second column selection lines CSL_dn<0:n> of the second memory bank Bank1, in response to the bank selection signal 'flag'. For example, in the case where one of the first column selection lines CSL_up<0:n> of the first memory bank Bank0 is to be enabled, the shared main decoding unit 200 is configured to generate the column selection signal 'Yi_up' configured to enable the first column selection lines CSL_up<0:n> of the first memory bank Bank0, in response to the bank selection signal 'flag'. On the other hand, in the case where one of the second column selection lines CSL_dn<0:n> of the second memory bank Bank' is to be enabled, the shared main decoding unit 200 generates the column selection signal 'Yi_dn' configured to enable the second column selection lines CSL_dn<0:n> of the second memory bank Bank1, in response to the bank selection signal 'flag'.

By employing either of these two operation manners, the shared main decoding unit 200 can be shared by the first and second memory banks Bank0 and Bank1. That is, the plurality of memory banks constituting the stack bank structure, i.e., Bank0 and Bank1, can share the same main decoding circuit 200 according to the embodiment, whereas the separate main decoding circuit is required for each memory bank constituting the stack bank structure according to the prior art in FIG. 1.

Figure 3:
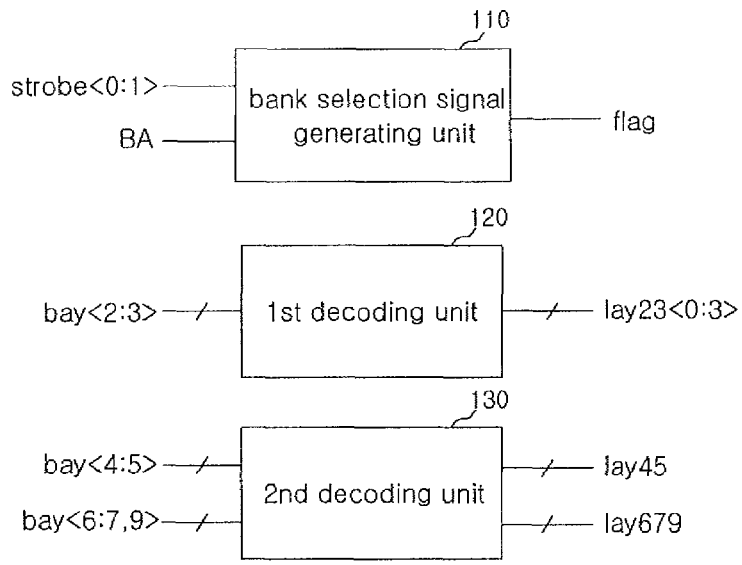
FIG. 3 is a block diagram schematically showing a configuration of an embodiment of a predecoding unit of FIG. 2.

FIG. 3 is a block diagram schematically showing a configuration of an embodiment of the predecoding unit 100 of FIG. 2. As shown in FIG. 3, the predecoding unit 100 can include a bank selection signal generating unit 110, a first decoding unit 120, and a second decoding unit 130. The bank selection signal generating unit 110 is configured to receive the bank address signal 'BA' and the strobe signals 'strobe<0:1>' to generate the bank selection signal 'flag'. The bank selection signal 'flag' includes information for selecting one of the first and second memory banks Bank0 and Bank1. In the embodiment, the bank selection signal 'flag' has a logic high level when the read/write operation is to be performed on the first memory bank Bank0, and has a logic low level when the read/write operation is to be performed on the second memory bank Bank1.

The first decoding unit 120 is configured to receive the column address signals 'bay<2:3>' to generate the column decoding signals 'lay23<0:3>'. The first decoding unit 120 can comprise a conventional decoder circuit that decodes the column address signals 'bay<2:3>'. In the prior art of FIG. 1, the column address signals 'bay<2:3>' need to be decoded with the strobe signals 'strobe<0:1>' in order that the conventional semiconductor memory apparatus can respectively transfer the column decoding signals different from each other (i.e., 'lay23_up<0:3>' and 'lay23_dn<0:3>') to the separate main decoders Main_DEC included in the first and second memory banks Bank0 and Bank1. However in accordance to this embodiment, is unnecessary for the semiconductor memory apparatus 1 to generate the separate column decoding signals to be respectively transferred to the first memory bank Bank0 and the second memory bank Bank1 because the semiconductor memory apparatus 1 includes the shared main decoding unit 200.

The second decoding unit 130 is configured to respectively receive the column address signals 'bay<4:5>' and 'bay<6:7, 9>' to generate the column decoding signals 'lay45' and 'lay679'.

Figure 4:
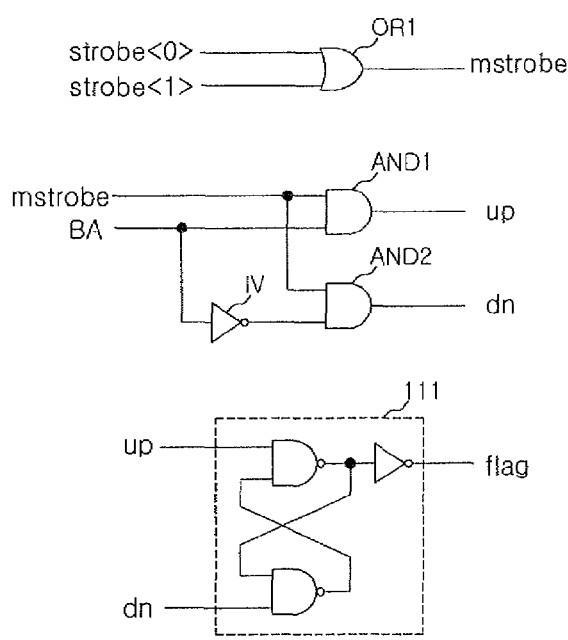
FIG. 4 is a diagram showing a configuration of an embodiment of a bank selection signal generating unit of FIG. 3.

FIG. 4 is a diagram showing a configuration of an embodiment of the bank selection signal generating unit 110 of FIG. 3. As shown in FIG. 4, the bank selection signal generating unit 110 can include a first OR gate OR1, first and second AND gates AND1 and AND2, an inverter IV, and a SR latch 111.

The first OR gate OR1 is configured to receive the strobe signals 'strobe<0:1>' to generate a main strobe signal 'mstrobe'. Therefore, the main strobe signal 'mstrobe' is generated as a pulse signal having a logic high level, whenever the read/write operation is performed on the first memory bank Bank0 and whenever the read/write operation is performed on the second memory bank Bank1.

The first AND gate AND1 is configured to receive the main strobe signal 'mstrobe' and the bank address signal 'BA' to generate an up signal 'up'. Therefore, if the main strobe signal 'mstrobe' and the bank address signal 'BA' are both at a logic high level, then the up signal 'up' of a logic high level is generated. The inverter IV inverts the bank address signal 'BA'. The second AND gate AND2 is configured to receive an output of the inverter IV and the main strobe signal 'mstrobe' to generate a down signal 'dn'. Therefore, if the main strobe signal 'mstrobe' is at the logic high level and the bank address signal 'BA' is at a logic low level, then the down signal 'dn' of a logic high level is generated. For example, the bank address signal 'BA' is inputted at the logic high level when the first memory bank Bank0 is to be selected and is inputted at the logic low level when the second memory bank Bank1 is to be selected. Accordingly respective logic levels of the up signal 'up' and the down signal 'dn' can be changed based on the logic level of the bank address signal 'BA'. The SR latch 111 is configured to receive both the up signal 'up' and the down signal 'dn' to generate the bank selection signal 'flag'. Therefore, the SR latch 111 is configured to generate the bank selection signal 'flag' at the logic high level until the down signal 'dn' is enabled if the up signal 'up' is enabled, and to generate the bank selection signal 'flag' at the logic low level until the up signal 'up' is enabled if the down signal 'dn' is enabled. However, it is understood herein that this embodiment is not intended to be limited to the above-described configuration, any configuration that can change the logic level of the bank selection signal 'flag' so as to select one of the first and second memory banks Bank0 and Bank1 can be employed as the bank selection signal generating unit 110. In addition, it will be understood by those skilled in the art that the bank selection signal generating unit 110 can be included in the shared main decoding unit 200 in some alternative implementations.

Figure 5:
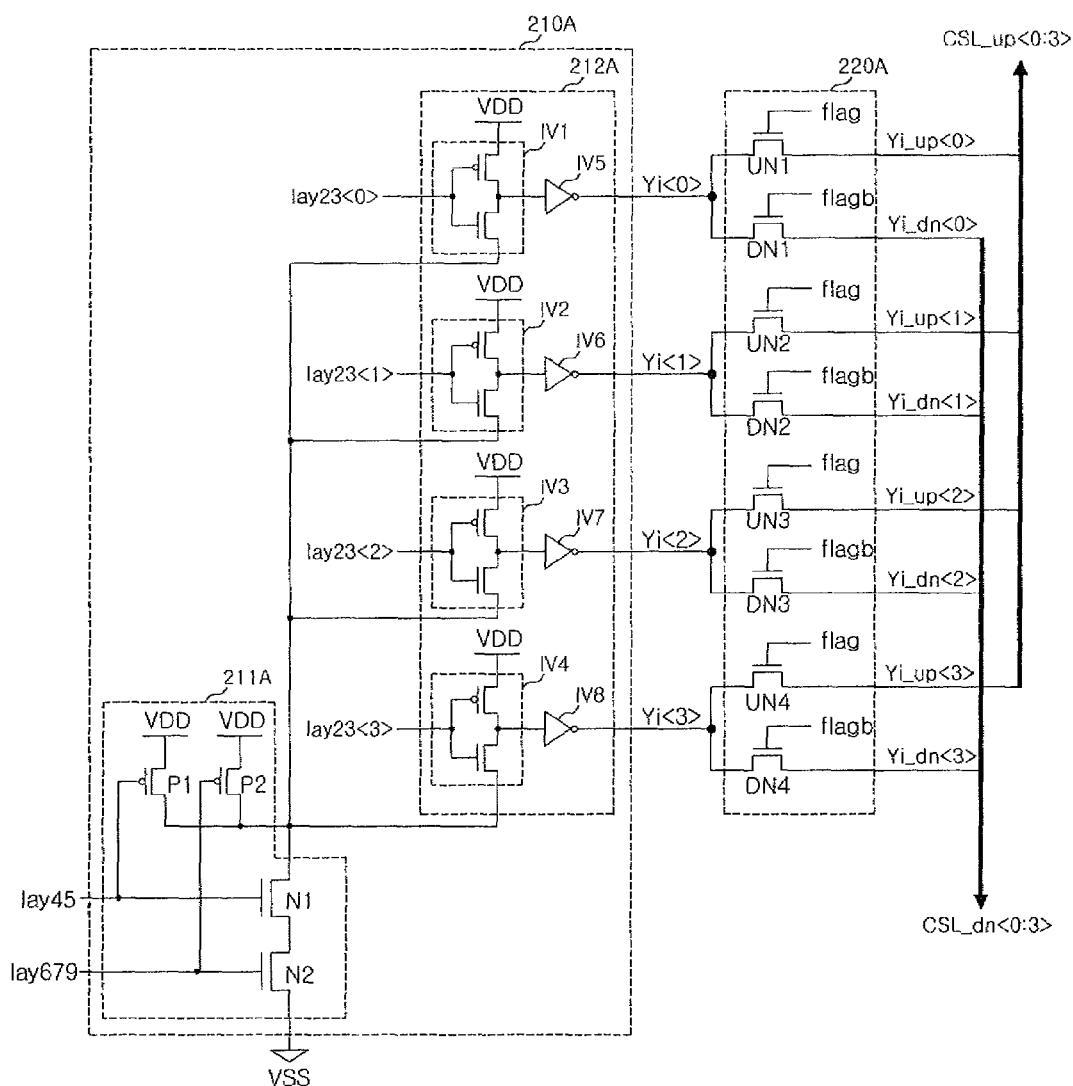
FIG. 5 is a diagram showing a configuration of an embodiment of a shared main decoding unit of FIG. 2.

FIG. 5 is a diagram showing a configuration of an embodiment of the shared main decoding unit 200 of FIG. 2, according to the first operational manner. The FIG. 5 shows a configuration to selectively enable four column selection lines among the first column selection lines CSL_up<0:n> of the first memory bank Bank0 and four column selection lines among the second column selection lines CSL_dn<0:n> of the second memory bank Bank1. As described above, such a configuration exists in plurality so as to constitute the shared main decoding unit 200A. As shown in FIG. 5, the shared main decoding unit 200A includes a shared column selection signal generating unit 210A and a switching unit 220A. The shared column selection signal generating unit 210A is configured to receive the column decoding signals 'lay23<0:3>', 'lay45' and 'lay679' to generate shared column selection signals 'Yi<0:3>'.

The shared column selection signal generating unit 210A can include an enable unit 211A and a column selection signal generating unit 212A. The enable unit 211A is configured to enable the shared column selection signal generating unit 210A. More specifically, the enable unit 211A is configured to apply a driving voltage VSS to the column selection signal generating unit 212A in response to the column decoding signals 'lay45' and 'lay679'. If the driving voltage VSS is applied to the column selection signal generating unit 212A, then the column selection signal generating unit 212A is enabled, and then respectively generates the shared column selection signals 'Yi<0:3>' in response to the column decoding signals 'lay23<0:3>'.

The switching unit 220A is configured to selectively provide the shared column selection signals 'Yi<0:3>' to the first column selection lines CSL_up<0:3> of the first memory bank Bank0 as the column selection signals 'Yi_up<0:3>' and to the second column selection lines CSL_dn<0:3> of the second memory bank Bank1 as the column selection signals 'Yi_dn<0:3>', in response to the bank selection signal 'flag'. That is, the switching unit 220A is configured to provide the shared column selection signals 'Yi<0:3>' to the first column selection lines CSL_up<0:3> of the first memory bank Bank0 when the bank selection signal 'flag' is at the logic high level, and to provide the shared column selection signals 'Yi<0:3>' to the second column selection lines CSL_dn<0:3> of the second memory bank Bank1 when the bank selection signal 'flag' is at the logic low level. Since the switching unit 220A is selectively and electrically connected to the first column selection lines CSL_up<0:3> of the first memory bank Bank0 and the second column selection lines CSL_dn<0:3> of the second memory bank Bank1 in response to the bank selection signal 'flag', the switching unit 220A then allows the first and second memory banks Bank0 and Bank1 to share the shared main decoding unit 200A without increasing a load on the shared main decoding unit 200A facing the first column selection lines CSL_up<0:3> and the second column selection lines CSL_dn<0:3>.

As shown in FIG. 5, the enable unit 211A includes first and second PMOS transistors P1 and P2 and first and second NMOS transistors N1 and N2. The first PMOS transistor P1 and the first NMOS transistor N1 are configured to respectively receive column decoding signals 'lay45' through their gate terminals, and the second PMOS transistor P2 and the second NMOS transistor N2 respectively receive column decoding signals 'lay679' through their gate terminals. Therefore, only when the column decoding signals 'lay45' and 'lay679' are both enabled, then the enable unit 211A provides the driving voltage VSS to the column selection signal generating unit 212A. If either or both of the column decoding signals 'lay45' and 'lay679' are disabled, then the enable unit 211A provides a precharge voltage VDD to the column selection signal generating unit 212A and thus substantially prevents the shared column selection signals 'Yi<0:3>' from being generated.

The column selection signal generating unit 212A includes first to eighth inverters IV1 to IV8. If the driving voltage VSS is applied to the column selection signal generating unit 212A, the first to fourth inverters IV1 to IV4 are respectively enabled to invert the column decoding signals 'lay23<0:3>'. The fifth to eighth inverters IV5 to IV8 respectively invert outputs of the first to fourth inverters IV1 to IV4 to generate the shared column selection signals 'Yi<0:3>'.

The switching unit 220A includes first to fourth switching transistors UN1 to UN4 and fifth to eighth switching transistors DN1 to DN4. The first to fourth switching transistors UN1 to UN4 respectively receive the bank selection signal 'flag' through their gate terminals, and respectively provide the shared column selection signals 'Yi<0:3>' to the corresponding first column selection lines CSL_up<0:3> of the first memory bank Bank0 as the column selection signals 'Yi_up<0:3>' when the first to fourth switching transistors UN1 to UN4 are respectively turned on. On the other hand, the fifth to eighth switching transistors DN1 to DN4 respectively receive an inverted signal 'flagb' of the bank selection signal 'flag' through their gate terminals, and respectively provide the shared column selection signals 'Yi<0:3>' to the corresponding second column selection lines CSL_dn<0:3> of the second memory bank Bank1 as the column selection signals 'Yi_dn<0:3>' when the fifth to eighth switching transistors DN1 to DN4 are respectively turned on.

Figure 6:
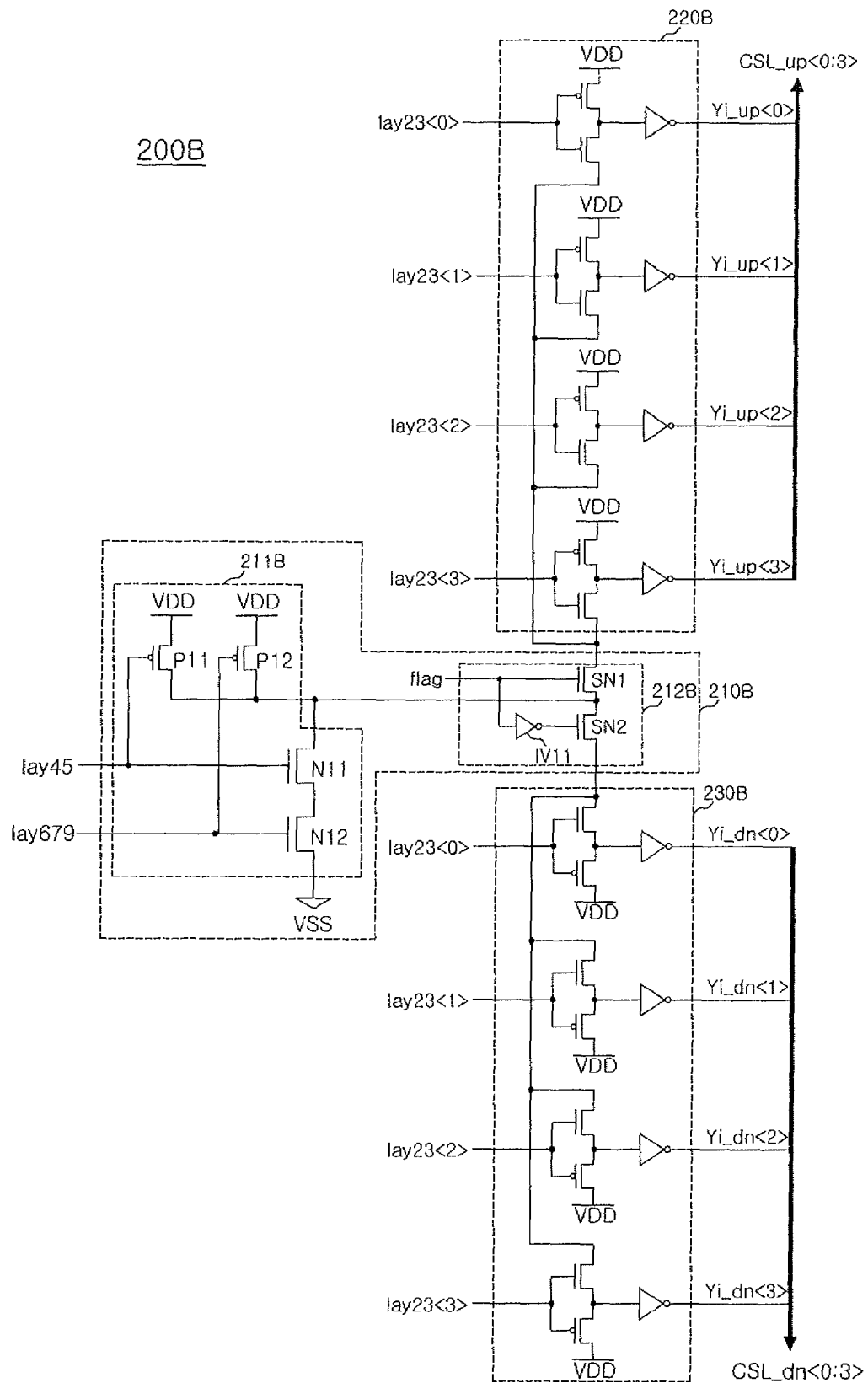
FIG. 6 is a diagram showing a configuration of another embodiment of the shared main decoding unit of FIG. 2.

FIG. 6 is a diagram showing a configuration of another embodiment of the shared main decoding unit 200 of FIG. 2, according to the second operational manner. As in FIG. 5, FIG. 6 shows a configuration to selectively enable four column selection lines among the first column selection lines CSL_up<0:n> of the first memory bank Bank0 and four column selection lines among the second column selection lines CSL_dn<0:n> of the second memory bank Bank1. As described above, such a configuration exists in plurality so as to constitute the shared main decoding unit 200B. As shown in FIG. 6, the shared main decoding unit 200B includes an enable unit 210B and first and second column selection signal generating units 220B and 230B. The enable unit 210B is configured to receive the column decoding signals 'lay45' and 'lay679' and the bank selection signal 'flag' to selectively enable the first and second column selection signal generating units 220B and 230B.

The enable unit 210B includes a power supply unit 211B and a switching unit 212B. The power supply unit 211B includes first and second PMOS transistors P11 and P12 and first and second NMOS transistors N11 and N12. The first PMOS transistor P11 and the first NMOS transistor N11 are configured to respectively receive the column decoding signals 'lay45' through their gate terminals, and the second PMOS transistor P12 and the second NMOS transistor N12 are configured to respectively receive the column decoding signal 'lay679' through their gate terminals. Therefore, only when the column decoding signals 'lay45' and 'lay679' are both enabled, the power supply unit 211B then provides the driving voltage VSS to the switching unit 212B. The switching unit 212B includes first and second switching transistors SN1 and SN2. The first switching transistor SN1 is configured to receive the bank selection signal 'flag' through its gate terminal, and to provides the driving voltage VSS to the first column selection signal generating unit 220B when the first switching transistor SN1 is turned on. On the other hand, the second switching transistor SN2 is configured to receive an inverted signal 'flagb' of the bank selection signal 'flag' through its gate terminal, and provides the driving voltage VSS to the second column selection signal generating unit 230B when the second switching transistor SN2 is turned on.

If the driving voltage VSS is applied to the first column selection signal generating unit 220B, the first column selection signal generating unit 220B generates the column selection signals 'Yi_up<0:3>' configured to select the corresponding first column selection lines CSL_up<0:3> of the first memory bank Bank0, in response to the column decoding signals 'lay23<0:3>'. On the other hand, if the driving voltage VSS is applied to the second column selection signal generating unit 230B, the second column selection signal generating unit 230B generates the column selection signals 'Yi_dn<0:3>' configured to select the second column selection lines CSL_dn<0:3> of the second memory bank Bank1, in response to the column decoding signals 'lay23<0:3>'. The first column selection signal generating unit 220B and the second column selection signal generating unit 230B respectively include eight inverters, and have substantially the same configuration as the column selection signal generating unit 212A of FIG. 5, thus a detailed description thereon will be omitted.

Consequently, if the column decoding signals 'lay45' and 'lay679' are both enabled and the bank selection signal 'flag' is at the logic high level, the shared main decoding unit 200B then enables the first column selection signal generating unit 220B and generates the column selection signals 'Yi_up<0:3>' configured to enable the corresponding first column selection lines CSL_up<0:3> of the first memory bank Bank0. On the other hand, if the column decoding signals 'lay45' and 'lay679' are both enabled and the bank selection signal 'flag' is at the logic low level, the shared main decoding unit 200B then enables the second column selection signal generating unit 230B and generates the column selection signals 'Yi_dn<0:3>' configured to enable the corresponding second column selection lines CSL_dn<0:3> of the second memory bank Bank1.

An operation of the semiconductor memory apparatus 1 according to the embodiments will now be described with reference to FIGS. 2 to 7.

Figure 7:
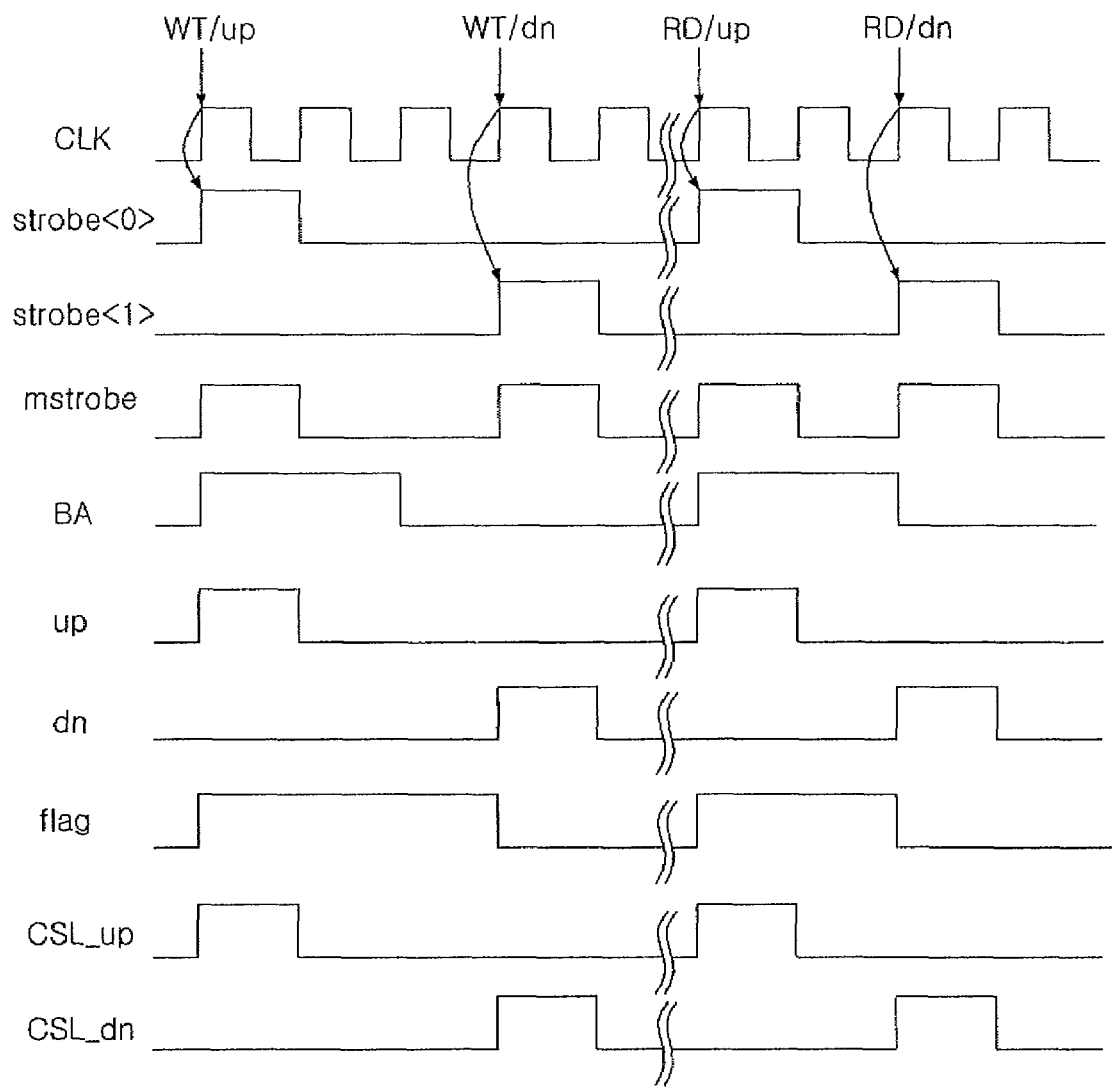
FIG. 7 is a timing diagram showing an operation of the semiconductor memory apparatus of FIG. 2, according to the embodiment.

FIG. 7 is a timing diagram showing an operation of the semiconductor memory apparatus 1 of FIG. 2, according to the embodiment of the present invention. In order to perform the read/write operation on the first and second memory banks Bank0 and Bank1, read/write commands 'RD/up', 'WT/up', 'RD/dn' and 'WT/dn' are inputted to the semiconductor memory apparatus 1 via a pad. The read/write commands 'RD/up' and 'WT/up' are signals that are used to instruct the semiconductor memory apparatus 1 to perform the read/write operation on the first memory bank Bank0, and the read/write commands 'RD/dn' and 'WT/dn' are signals that are used to instruct the semiconductor memory apparatus 1 to perform the read/write operation on the second memory bank Bank1. If the read/write command 'RD/up' or 'WT/up' is inputted to the semiconductor memory apparatus 1, the strobe signal 'strobe<0>' is then generated as a pulse signal, and if the read/write command 'RD/dn' or 'WT/dn' is inputted to the semiconductor memory apparatus 1, the strobe signal 'strobe<1>' is generated as a pulse signal, and then the strobe signals 'strobe<0:1>' are combined into the main strobe signal 'mstrobe'. Therefore, the main strobe signal 'mstrobe' is generated as a pulse signal having a pulse width corresponding to one period of a clock signal 'CLK', whenever the read/write operation is to be performed on the first memory bank Bank0 and whenever the read/write operation is to be performed on the second memory bank Bank1. In addition, in order to inform which one of the first and second memory banks Bank0 and Bank1 is associated with the read/write operation, the bank address signal 'BA' is inputted. When the first write command 'WT/up' is inputted, the bank address signal 'BA' has the logic high level, because the first write command 'WT/up' is associated with the first memory bank Bank0. When the second write command 'WT/dn' is inputted, the bank address signal 'BA' has the logic low level, because the second write command 'WT/dn' is associated with the second memory bank Bank1. Afterwards, when the first read command 'RD/up' is inputted, the bank address signal 'BA' has the logic high level, because the first read command 'RD/up' is associated with the first memory bank Bank0, and when the second read command 'RD/dn' is inputted, the bank address signal 'BA' has the logic low level, because the second read command 'RD/dn' is associated with the second memory bank Bank1.

As shown in FIG. 7, the bank selection signal generating unit 110 included in the predecoding unit 100 generates the up signal 'up' and the down signal 'dn' in response to the main strobe signal 'mstrobe' and the bank address signal 'BA'. In addition, the SR latch 111 included in the bank selection signal generating unit 110 receives the up signal 'up' and the down signal 'dn' to generate the bank selection signal 'flag'.

If the first write command 'WT/up' is inputted and the column address signals 'bay<2:3>', 'bay<4:5>' and 'bay<6:7,9>' are inputted to select one of the first column selection lines CSL_up<0:n> of the first memory bank Bank0, the predecoding unit 100 then generates the column decoding signals 'lay23<0:3>', 'lay45' and 'lay679'.

The shared main decoding unit 200A of FIG. 5 is configured to generate the shared column selection signals 'Yi<0:3>' in response to the column decoding signals 'lay23<0:3>', 'lay45' and 'lay679'. Since the bank selection signal 'flag' corresponding to the first write command 'WT/up' is at the logic high level, the switching unit 220A included in the shared main decoding unit 200A then provides the shared column selection signals 'Yi<0:3>' to the first column selection lines CSL_up<0:3> of the first memory bank Bank0. Therefore, the shared main decoding unit 200A can enable the first column selection lines CSL_up<0:3> of the first memory bank Bank0 in response to the bank selection signal 'flag'.

The shared main decoding unit 200B of FIG. 6 provides the driving voltage VSS to the first column selection signal generating unit 220B in response to the column decoding signals 'lay45' and 'lay679' and the bank selection signal 'flag' of the logic high level. Therefore, the first column selection signal generating unit 220B generates the column selection signals 'Yi_up<0:3>' configured to enable the corresponding first column selection lines CSL_up<0:3> of the first memory bank Bank0, in response to the corresponding column decoding signals 'lay23<0:3>'. Consequently, the semiconductor memory apparatus 1 can perform the write operation on the first memory bank Bank0 by using the shared main decoding unit 200B.

On the other hand, if the second write command 'WT/dn' is inputted and the column address signals 'bay<2:3>', 'bay<4:5>' and 'bay<6:7,9>' are inputted to select one of the second column selection lines CSL_dn<0:n> of the second memory bank Bank1, the predecoding unit 100 then generates the column decoding signals 'lay23<0:3>', 'lay45' and 'lay679'.

The shared main decoding unit 200A of FIG. 5 is configured to generate the shared column selection signals 'Yi<0:3>' in response to the column decoding signals 'lay23<0:3>', 'lay45' and 'lay679'. Since the bank selection signal 'flag' corresponding to the second write command 'WT/dn' is at the logic low level, then the switching unit 220A included in the shared main decoding unit 200A provides the shared column selection signals 'Yi<0:3>' to the second column selection lines CSL_dn<0:3> of the second memory bank Bank1. Therefore, the shared main decoding unit 200A can enable the second column selection lines CSL_dn<0:3> of the second memory bank Bank1 in response to the bank selection signal 'flag'.

The shared main decoding unit 200B of FIG. 6 provides the driving voltage VSS to the first column selection signal generating unit 220B in response to the column decoding signals 'lay45' and 'lay679' and the bank selection signal 'flag' of the logic low level. Therefore, the first column selection signal generating unit 220B generates the column selection signals 'Yi_dn<0:3>' configured to enable the corresponding second column selection lines CSL_dn<0:3> of the second memory bank Bank1, in response to the corresponding column decoding signals 'lay23<0:3>'. Consequently, the semiconductor memory apparatus 1 can perform the write operation on the second memory bank Bank1 by using the shared main decoding unit 200B.

A read operation associated with the first read command 'RD/up' and a read operation associated with the second read command 'RD/dn' are respectively performed in a manner similar to the above-described write operation, and thus, a detailed description thereon will be omitted.

While certain embodiments have been described above, it will be understood to those skilled in the art that the embodiments described are by way of example only. Accordingly, the device and method described herein should not be limited based on the described embodiments. Rather, the apparatus described herein should only be limited in light of the claims that follow when taken in conjunction with the above description and accompanying drawings.

What is claimed is:

1. A main decoding circuit comprising:
   a shared column selection signal generating unit configured to generate a shared column selection signal in response to a column decoding signal; and
   a switching unit configured to be coupled with column selection lines of a first memory bank and a second memory bank in common and to selectively provide the shared column selection signal to one of the column selection line of the first memory bank and the column selection line of the second memory bank in response to a bank selection signal.

2. The main decoding circuit of claim 1, wherein the column decoding signal is configured to be generated by decoding a column address signal.

3. The main decoding circuit of claim 1, wherein the shared column selection signal generating unit includes:
   an enable unit configured to enable the shared column selection signal generating unit in response to the column decoding signal; and
   a column selection signal generating unit configured to generate the shared column selection signal in response to the column decoding signal.

4. The main decoding circuit of claim 1, wherein the main decoding circuit further includes a bank selection signal generating unit configured to generate the bank selection signal in response to a strobe signal and a bank address signal.

5. The main decoding circuit of claim 4, wherein the strobe signal includes information for a read/write operation and the bank address signal includes information on the memory bank on which the read/write operation is to be performed.

6. A semiconductor memory apparatus comprising:
   a first column selection line coupled to a first memory bank;
   a second column selection line coupled to a second memory bank;
   a predecoding unit configured to receive a column address signal, a bank address signal and a strobe signal to subsequently generate a column decoding signal and a bank selection signal; and a shared main decoding unit configured to be coupled with the first and second column selection lines in common and to generate a shared column selection signal in response to the column decoding signal and to provide the shared column selection signal to one of the first and second column selection lines in response to the bank selection signal.

7. The semiconductor memory apparatus of claim 6, wherein the predecoding unit includes:
  a decoding unit configured to decode the column address signal to generate the column decoding signal; and
  a bank selection signal generating unit configured to generate the bank selection signal in response to the bank address signal and the strobe signal.

8. The semiconductor memory apparatus of claim 6, wherein the shared main decoding unit is configured to provide the shared column selection signal to the first column selection line when the bank selection signal selects the first memory bank, and to provide the shared column selection signal to the second column selection line when the bank selection signal selects the second memory bank.

9. The semiconductor memory apparatus of claim 8, wherein the shared main decoding unit includes:
  a shared column selection signal generating unit configured to generate the shared column selection signal in response to the column decoding signal; and
  a switching unit configured to selectively provide the shared column selection signal to one of the first and second column selection lines in response to the bank selection signal.

10. The semiconductor memory apparatus of claim 9, wherein the shared column selection signal generating unit includes:
  an enable unit configured to enable the shared column selection signal generating unit in response to the column decoding signal; and
  a column selection signal generating unit configured to generate the shared column selection signal in response to the column decoding signal.

11. A semiconductor memory apparatus comprising:
  a first column selection line coupled to a first memory bank;
  a second column selection line coupled to a second memory bank;
  a predecoding unit configured to receive a column address signal, a bank address signal and a strobe signal to generate a column decoding signal and a bank selection signal; and
  a shared main decoding unit configured to be coupled with the first and second column selection lines in common and to generate a column selection signal in response to the column decoding signal and the bank selection signal, such that the column selection signal is configured to enable one of the first and second column selection lines.

12. The semiconductor memory apparatus of claim 11, wherein the predecoding unit includes:
  a decoding unit configured to generate the column decoding signal subsequent to decoding the column address signal; and
  a bank selection signal generating unit configured to generate the bank selection signal in response to the bank address signal and the strobe signal.

13. The semiconductor memory apparatus of claim 11, wherein the shared main decoding unit includes:
  a first column selection signal generating unit configured to generate a column selection signal in response to the column decoding signal, such that the column selection signal is configured to enable the first column selection line;
  a second column selection signal generating unit configured to generate a column selection signal in response to the column decoding signal, such that the column selection signal is configured to enable the second column selection line; and
  an enable unit configured to selectively enable the first and second column selection signal generating units in response to the column decoding signal and the bank selection signal.

14. The semiconductor memory apparatus of claim 13, wherein the enable unit includes:
  a power supply unit configured to provide a driving voltage in response to the column decoding signal, wherein the driving voltage is configured to enable the first and second column selection signal generating units; and
  a switching unit configured to selectively provide the driving voltage to one of the first and second column selection signal generating units in response to the bank selection signal.

* * * * *